United States Patent [19]
Whiteside

[11] Patent Number: 5,642,079
[45] Date of Patent: Jun. 24, 1997

[54] AMPLIFIER WITH POLE/ZERO COMPENSATION

[75] Inventor: Frank A. Whiteside, Coppell, Tex.

[73] Assignee: Dallas Semiconductor Corporation, Dallas, Tex.

[21] Appl. No.: 536,895

[22] Filed: Sep. 29, 1995

[51] Int. Cl.$^6$ .................................................. H03F 1/34
[52] U.S. Cl. .......................... 330/260; 330/304; 330/306
[58] Field of Search .................................. 330/260, 304, 330/306; 333/28 R; 360/65; 375/229; 379/358

[56] References Cited

U.S. PATENT DOCUMENTS

| | | | |
|---|---|---|---|
| 3,383,616 | 5/1968 | Friend et al. | 330/304 X |
| 3,444,474 | 5/1969 | Borenstein et al. | 330/304 |
| 3,530,395 | 9/1970 | Prusha | 330/260 X |
| 4,458,212 | 7/1984 | Brehmer et al. | |
| 4,634,986 | 1/1987 | Brookshier. | |
| 4,862,103 | 8/1989 | Funada | 330/304 |
| 5,079,514 | 1/1992 | Mijuskovic. | |
| 5,198,700 | 3/1993 | Whiteside. | |
| 5,406,220 | 4/1995 | Jones III et al. | |

OTHER PUBLICATIONS

M. Ismail, et al. "A New MOSFET–C Universal Filter Structure for VLSI", IEEE Journal of Solid–State Circuits, vol. 23, No. 1, Feb. 1988, pp.183–194.
A. Abidi, "Linearization of Voltage–Controlled Oscillators Using Switched–Capacitor Feedback", IEEE Journal of Solid–State Circuits, vol. SC–22, No. 3, Jun. 1987, pp. 494–496.
M. H. Wakayama, et al., "A 30MHz Voltage–Controlled Oscillator with 0.17% Linearity", IEEE International Solid–State Circuits Conference, 1987, pp. 220–221.
Y. Tsividis, et al. "Continuous–Time MOSFET–C Filters in VLSI", IEEE Journal of Solid–State Circuits, vol. SC–21, No. 1, Feb. 1986, pp. 15–30.
D. Inami, et al. "An Adaptive Line Equalizer LSI for ISDN Subscriber Loops", IEEE Journal of Solid–State Circuits, vol. 23, No. 3, Jun. 1988, pp. 657–663.
M. Ishikawa, et al. "A CMOS Adaptive Line Equalizer", IEEE Journal of Solid–State Circuits, vol. SC–19, No. 5, Oct. 1984, pp. 788–793.
H. Takatori, et al. "Low–Power Line Equalizer for Digital Subscriber Loop" 1984 IEEE, 1984 IEEE, Section 1.6.1–1.6.6, pp. 26–31.
T. Suzuki et al. "A CMOS Switched–Capacitor Variable Line Equalizer" IEEE Journal of Solid–State Circuits, vol. SC–18, No. 6, Dec. 1983, pp. 700–705.
C. Rahim et al. "A High Performance Custom Standard Cell CMOS Equalizer for Telecommunications Applications" IEEE 1986 Custom Integrated Circuits Conference, pp. 391–394.

Primary Examiner—James B. Mullins
Attorney, Agent, or Firm—Jenkens & Gilchrist, P.C.

[57] ABSTRACT

An amplifier for providing a pole/zero compensated output signal by generating multiple pole/zero pairs at predetermined increasing frequencies, with the number of pole/zero pairs occurring at the increasing frequencies increasing geometrically. The amplifier includes three amplifier circuits cascaded in series to generate a first pole/zero pair at a predetermined frequency, and a second and a third pole/zero pair both generated at a second frequency two octaves above the first pole/zero pair. The first amplifier circuit configured to generate the first pole/zero pair and the second and third amplifier circuits each configured to generate the second and third pole/zero pairs. The relative spacing between each pole and its corresponding zero determines the amount of compensation performed.

8 Claims, 2 Drawing Sheets

AMPLIFIER WITH POLE/ZERO COMPENSATION

PARTIAL WAVER OF COPYRIGHT PROTECTION

A portion of the disclosure of this patent document contains material which is subject to copyright protection. The copyright owner has no objection to the facsimile reproduction of the patent disclosure, as it appears in the United States Patent and Trademark office patent files or records, but otherwise reserves all copyright rights whatsoever.

FIELD OF THE INVENTION

This invention relates to amplifier circuits, and more particularly, high frequency amplifier circuits providing pole/zero compensation.

CROSS REFERENCE TO RELATED APPLICATIONS

This application is related to the following U.S. patent applications:

| Ser. No. | TITLE | INVENTOR(S) |
| --- | --- | --- |
| 08/536,897 | Tunable Tone Control Circuit and a Device and Method for Tuning the RC Constants | Whiteside |
| 08/537,214 | Differential Cross Coupled Peak Detector | Smith |
| 08/536,023 | Over Sampled State Machine for Jitter Tolerant Pulse Detection | Smith et al. |
| 08/536,875 | Ones Density Monitor | Smith |
| 08/536,906 | Sample Point Adjustment | Smith et al. |

All of the related applications are filed on even date herewith, are assigned to the assignee of the present invention, and are hereby incorporated herein in their entirety by this reference thereto.

BACKGROUND OF THE INVENTION

The use of T1 transmission lines for the electronic transfer of information is based on twisted pair wiring, with separate pairs of wires being used for the transmit and receive sides of the T1 line. Standard T1 transmissions use an alternative-mark-inversion (AMI) format. The AMI format consists of "0" and "1" bits. The "0" bits being represented by the absence of a pulse and the "1" bits being represented by pulses of alternating polarity. The standard T1 transmission frequency for such data is typically at 1.544 megabits per second.

As information is transmitted over a T1 line, the attenuation of the information signal can typically range from zero DB with short lengths of T1 transmission lines to at least 30 DB of attenuation with lengths up to approximately 6,000 feet. Additionally, because of the AMI format of the signal pulses, as the lengths of T1 transmission lines increase the pulses can overlap or smear out over several bit times, this is known as intersymbol interference.

For signals sent over T1 lines with a length of about 100–650 feet, the attenuation, phase shift, and the frequency smearing of the signals caused by the T1 line can be compensated for by providing the signals with a pre-emphasis consisting of controlled amounts of overshoot and undershoot.

However as the length of the T1 line increases, the amount of attenuation, phase shift, and smearing of the signals becomes too great to be compensated for by signal pre-emphasis. As discussed above, as the length of the T1 transmission line approaches 6,000 feet, the transmitted pulses become smeared out over several bit times such that the pulses overlap and strongly interfere with each other. This makes the reconstruction and the interpretation of the original signals very difficult.

Therefore, when using T1 lines at lengths of about 6,000 feet, it is necessary to modify the transmitted signal by compensating for the attenuation and smearing in order to be able reconstruct the original transmitted signal. The compensation must supply an amount of gain that is similar to the loss that has been incurred in the T1 line.

SUMMARY OF THE INVENTION

The present invention overcomes the above identified problems by providing an amplifier with pole/zero generators to produce a compensated output.

Accordingly, it is an object of the present invention to provide an amplifier having pole/zero generators for reconstructing and recovering an attenuated signal transmitted over a T1 line.

It is a further object of the present invention to provide an amplifier with cascaded amplifier circuits to generate pole/zero pairs for recovering an attenuated signal transmitted over a T1 line.

It is yet another object of the present invention to provide cascaded amplifier circuits for generating pole/zero pairs at predetermined increasing frequencies, where the number of pole/zero pairs occurring at each frequency is doubled.

It is another object of the present invention to provide cascaded amplifier circuits to generate pole/zero pairs at predetermined frequencies, where the predetermined frequencies are spaced apart by a predetermined spacing.

It is still another object of the present invention to provide cascaded amplifier circuits having a first amplifier circuit generating a pole/zero pair at a predetermined frequency, and second and third amplifier circuits, both generating a pole/zero pair at a frequency two octaves above the first pole/zero pair.

In accordance with the above and other objects there is provided an amplifier having first, second, and third amplifier circuits cascaded in series for generating a compensated output with a first pole/zero pair generated at a predetermined frequency, and a second and a third pole/zero pair both generated at a frequency two octaves above the predetermined frequency.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION OF THE PRESENTLY PREFERRED EXEMPLARY EMBODIMENTS

Figure 1:
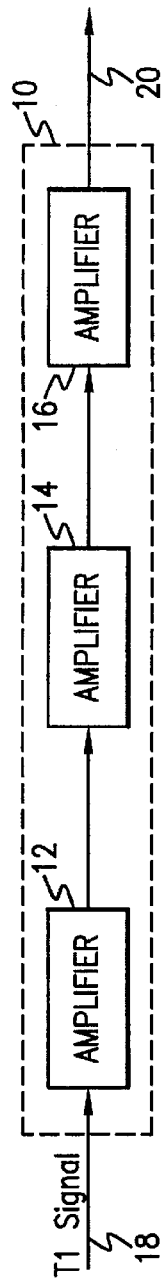
FIG. 1 is schematic block diagram illustrating a preferred embodiment of the present invention with three amplifiers cascaded in series.

Referring to FIG. 1, there is shown a schematic block diagram of an amplifier 10 having three differential amplifiers 12, 14 and 16 cascaded in series, for receiving a T1 signal over a T1 line 18 and producing a compensated output 20.

Figure 3:
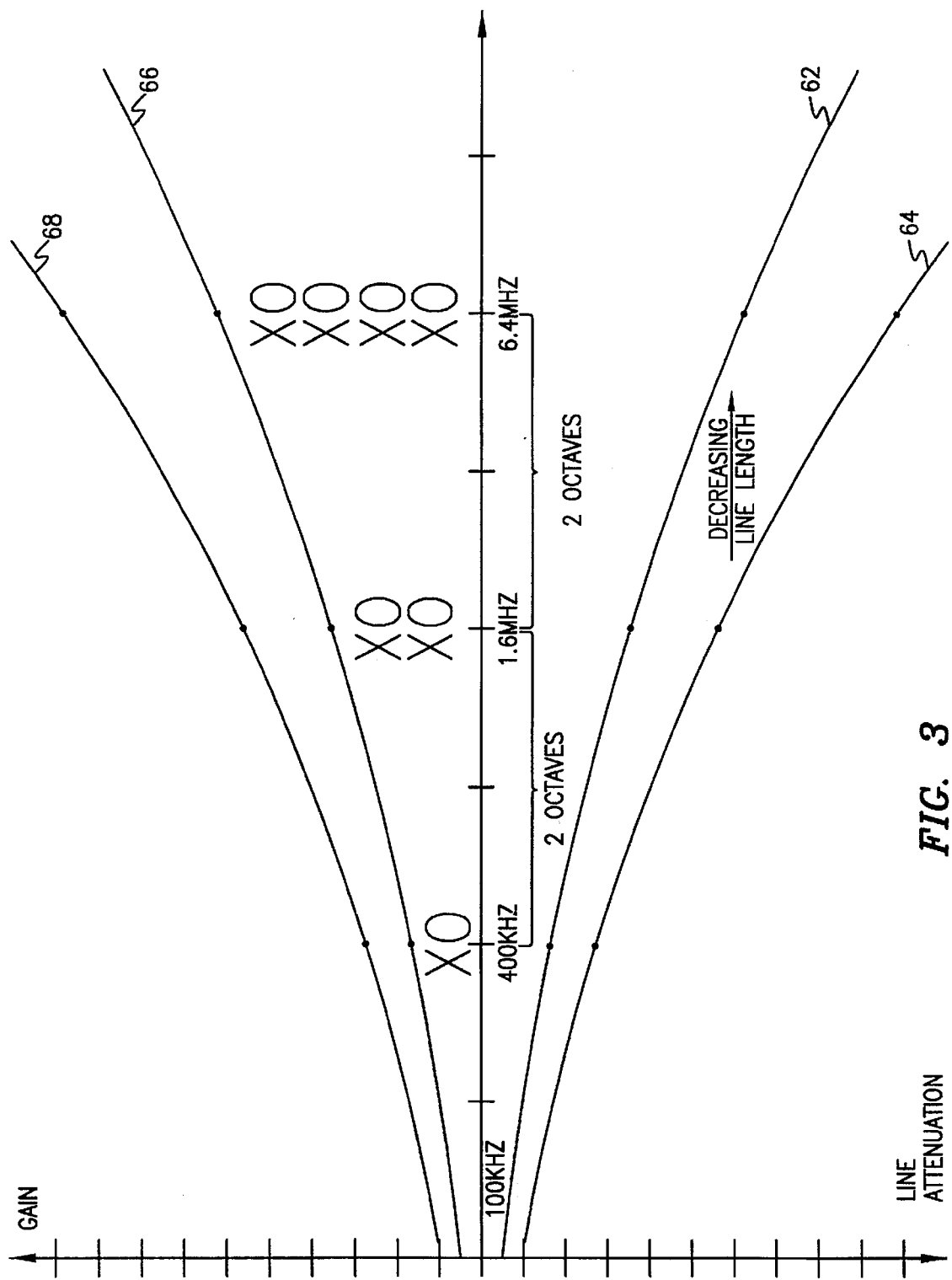
FIG. 3 a graph illustrating the attenuation of a cable versus frequency and the compensation provided by the present invention.

Amplifier 10 is configured to generate compensated output 20 with differential amplifier 12 generating a pole/zero pair at a predetermined frequency, and differential amplifiers 14 and 16 generating a second and a third pole/zero pair respectively, both occurring a frequency two octaves above the first pole/zero pair (See FIG. 3). Although amplifier 10 is shown to be configured to only generate three pole/zero pairs, it is contemplated to be within the scope of this invention that amplifier 10 could be configured to generate additional pole/zero pairs at increasing frequencies depending on the amount of attenuation and the frequency band of interest.

Figure 2:
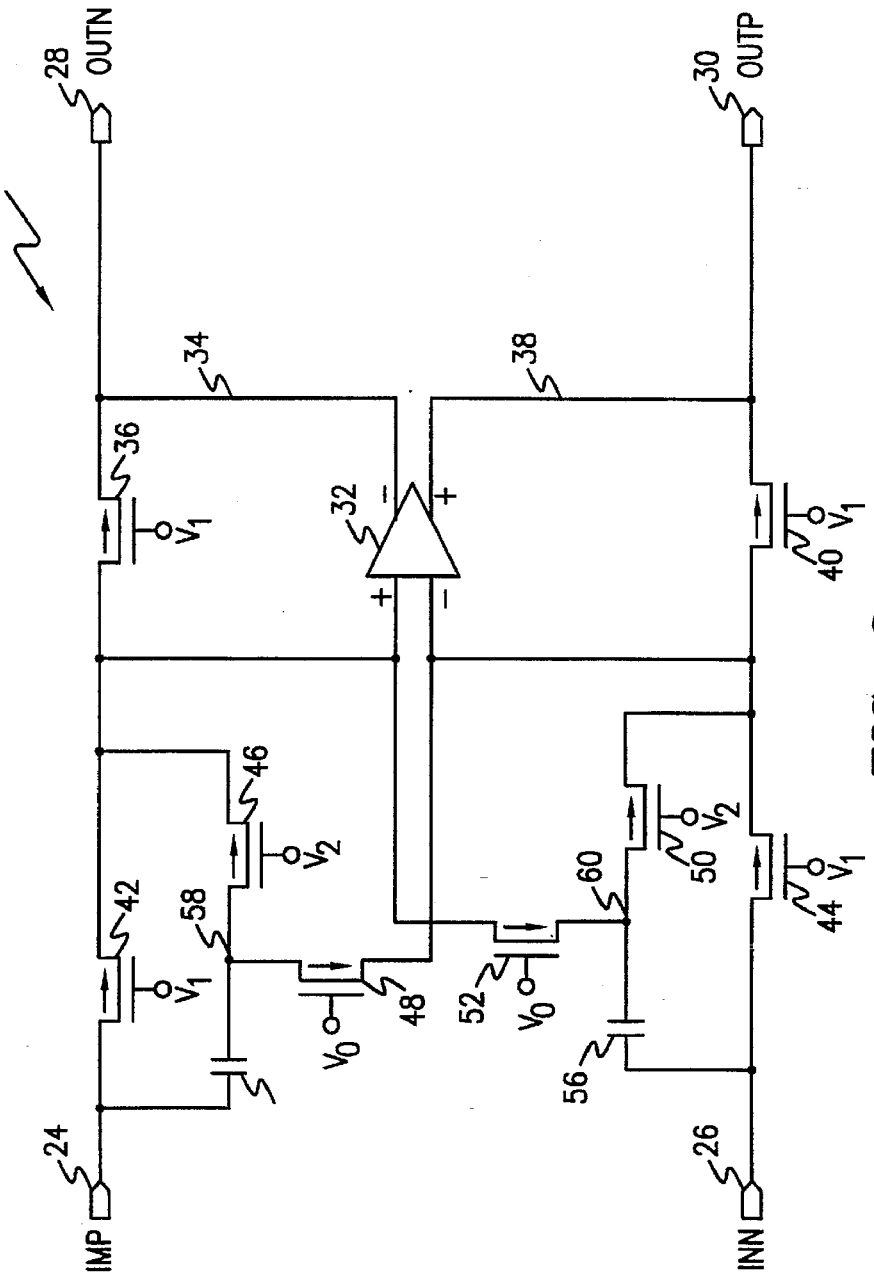
FIG. 2 is a schematic diagram illustrating an amplifier for generating pole/zero compensation in accordance with the present invention.

Referring now to FIG. 2, there is shown a schematic diagram of a differential amplifier circuit 22 illustrating a preferred embodiment of the differential amplifiers 12, 14 and 16 shown in FIG. 1. Although shown to be identical amplifiers, it is contemplated to be within the scope of the invention that amplifiers 12, 14 and 16 can vary in structure and design, so long as the desired number of pole/zero pairs can be generated to compensate for a determined attenuation.

Differential amplifier circuit 22 includes inputs 24 and 26, and outputs 28 and 30. Additionally, differential amplifier circuit 22 includes a differential operational amplifier 32 which is provided with positive and negative input terminals and positive and negative output terminals. A differential amplifier is used to maintain stability and avoid non-linearity problems in the circuit.

A first feedback loop 34 is coupled between the negative output and the positive input of differential operational amplifier 32 and includes a resistive element or MOSFET resistor 36.

A second feedback loop 38 is coupled between the positive output and the negative input of differential operational amplifier 32 and includes a resistive element or MOSFET resistor 40. The gates of MOSFET resistors 36 and 40 are each coupled to a first potential $V_1$. The pole of the pole/zero pair generated by differential amplifier circuit 22 is generated by MOSFET resistors 36 and 40 of feedback loops 34 and 38, with the resistance values of MOSFET resistors 36 and 40 determining the frequency location of the pole.

Amplifier circuit 22 includes a gain stabilizer which is primarily controlled by MOSFET resistors 42 and 44. MOSFET resistor 42 is coupled between input 24 and the positive input terminal of differential operational amplifier 32. MOSFET resistor 44 is coupled between input 26 and the negative input terminal of differential operational amplifier 32. The gates of MOSFET resistors 42 and 44 are also coupled to potential $V_1$.

Circuit 22 also includes MOSFET resistors 46, 48, 50 and 52, and capacitors 54 and 56. MOSFET resistor 46 and capacitor 54 are coupled in series with one another with a node 58 therebetween, and are coupled in parallel with MOSFET resistor 42. MOSFET resistor 48 is coupled between node 58 and the negative input terminal of differential operational amplifier 32.

MOSFET resistor 50 and capacitor 56 are also coupled in series with one another forming node 60 therebetween, and are coupled in parallel with MOSFET resistor 44. MOSFET resistor 52 is coupled between node 60 and the positive input terminal of differential operational amplifier 32. The gates of MOSFET resistors 46 and 50 are coupled to a second potential $V_2$, and the gates of MOSFET resistors 48 and 52 coupled to a third potential $V_0$. The zero of the pole/zero pair generated by differential amplifier circuit 22 is generated by MOSFET resistors 46, 48, 50 and 52, and capacitors 54 and 56. The resistance values of MOSFET resistors 46, 48, 50 and 52 and the capacitance values of capacitors 54 and 56 determine the center frequency of the pole/zero pair.

It is further contemplated to be within the scope of the present invention that the spacing between the pole/zero pairs and the frequency at which the pole/zero pairs are generated can be varied accordingly by varying the parameters of amplifier 10, which includes varying the resistance of the MOSFET resistors and the capacitance of the capacitors.

Referring now to FIG. 3, there is shown a graph wherein the lines 62 and 64 in bottom half of the graph represent the attenuation of a signal transmitted through different lengths of T1 transmission lines versus frequency where the length of T1 transmission represented by line 62 is shorter in length than line 64. Additionally, lines 66 and 68 in the top half of the graph represent the gain versus frequency needed to compensate for the attenuation represented in lines 62 and 64, respectively.

The curves of lines 62 and 64 can be represented by the following equation:

$$\log A = LK\sqrt{f}$$

where 'A' represents attenuation, 'L' represents the length of the line, '$f$' the frequency, and 'K' is a constant that is a function of the physical properties of the T1 transmission wire. As is illustrated in FIG. 3, the amount of line attenuation increases with increasing frequency and increasing line length.

To reconstruct attenuated signals having these characteristics, an amplifier is needed that can produce offsetting curves or equalization curves which remove the attenuation and distortion by flattening the frequency response within a band of frequencies of interest, i.e. an amount of gain must be supplied that increases geometrically with increasing frequency to compensate for the logarithmic and square root characteristics of the attenuation occurring in a length of T1 transmission line.

For example, given that the standard transmission rate for a T1 line is 1.544 megabits per second a band of frequency interest would be between 400 KHz and 1.6 MHz. Therefore, if the attenuation of a signal transmitted through a length of T1 line is represented by line 62 of FIG. 3, the components of amplifier 10 would be configured such that a first pole/zero pair would be generated by differential amplifier circuit 12 at a first frequency of 400 KHz, and second and third pole/zero pairs would be generated by amplifiers 14 and 16 respectively, with both pole/zero pairs being generated at a frequency of 1.6 MHz, two octaves above the first pole/zero pair.

As illustrated in FIG. 3, it is the geometric progression of the increasing number of pole/zero pairs with increasing frequency that provides the compensation for the logarithmic characteristics of the attenuation of the signal and it is the spacing of the pole/zero pairs every two octaves that provides for the square root of the frequency.

As a particular band of frequencies of interest changes or increases, it is contemplated that additional pole/zero pairs would be generated to compensate accordingly. This would be done by cascading additional amplifiers in series in accordance with the present invention.

It is understood that at low frequencies the characteristics of T1 line or cable resembles that of a piece of wire instead of a transmission line. These characteristics create additional signal attenuation known as resistive attenuation which is not dependent upon frequency. If needed, amplifier 10 could also be configured to generate an additional pole/zero pair at zero frequency, otherwise known as DC gain, to provide additional compensation for the resistive attenuation.

CONCLUSION

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A circuit for producing a compensated output, comprising:
   a. means for generating a number of pole/zero pairs at increasing frequency locations;
   b. said means for generating including a plurality of amplifiers;
   c. at least one of said plurality of amplifiers including a first input node, a second input node, a first output node and a second output node, and a differential operational amplifier;
   d. said differential operational amplifier including a positive input terminal, a negative input terminal, a positive output terminal, and a negative output terminal, said positive output terminal being electrically connected to said second output node and said negative output terminal being electrically connected to said first output node;
   e. said negative output terminal being coupled to said positive input terminal via a first feedback loop including a first field effect transistor;
   f. said positive output terminal being coupled to said negative input terminal via a second feedback loop including a second field effect transistor;
   g. said first input node being connected to said positive input terminal via a first transistor coupled in parallel to a first capacitive element and a second transistor in series, said first capacitive element and said second transistor being coupled together at a first cross node, said first cross node being connected to said negative input terminal via a first cross-coupling transistor; and
   h. said second input node being connected to said negative input terminal via a third transistor coupled in parallel to a second capacitive element and a fourth transistor in series, said second capacitive element and said fourth transistor being coupled together at a second cross node, said second cross node being connected to said positive input terminal via a second cross-coupling transistor;
   i. wherein each of said increasing frequency locations are separated by a predetermined spacing, said number of pole/zero pairs at each of said increasing frequency locations increasing geometrically by a fixed factor.

2. A circuit as recited in claim 1, wherein:
   a. said predetermined spacing is approximately two octaves.

3. A circuit as recited in claim 1, wherein:
   a. said fixed factor is approximately two.

4. A circuit as recited in claim 1, wherein:
   a. said plurality of amplifiers are coupled in series.

5. Amplifier circuitry comprising a plurality of amplifiers that are cascaded, wherein each of the plurality of amplifiers comprises:
   a. a differential operational amplifier including an input and an output, each of said input and output including positive and negative terminals;
   b. a pole generator coupled between said output of said differential operational amplifier and said input of said differential operational amplifier;
   c. a zero generator coupled between an input of the amplifier and said input of said differential operational amplifier, said zero generator including a first cross node and a second cross node, said first cross node being connected to said negative terminal of said input of said differential operational amplifier via a first cross-coupling transistor, said second cross node being connected to said positive terminal of said input of said differential operational amplifier via a second cross-coupling transistor; and
   d. a gain stabilizer coupled between said input of the amplifier and said input of said differential operational amplifier;
   e. wherein the plurality of cascaded amplifiers generate a number of pole/zero pairs at increasing frequency locations such that each of the increasing frequency locations are separated by a predetermined spacing, with the number of pole/zero pairs generated at each of the increasing frequency locations increases geometrically by a fixed factor.

6. An amplifier as recited in claim 5, wherein:
   a. said pole generator including a first pole MOSFET coupled between said negative terminal of said output of said differential operational amplifier and said postitive terminal of said input of said differential operational amplifier, and a second pole MOSFET coupled between said postive terminal of said output of said differential operational amplifier and said negative terminal of said input of said differential operational amplifier.

7. An amplifier as recited in claim 5, wherein:
   a. said zero generator includes a first zero MOSFET coupled in series with a first capacitor creating said first cross node therebetween, and coupled between said input of the amplifier and said positive terminal of said input of said differential operational amplifier, and a second zero MOSFET coupled in series with a second capacitor creating said second cross node therebetween, and coupled between said input of the amplifier and said negative terminal of said input of said differential amplifier.

8. An amplifier as recited in claim 7, wherein:
   a. said gain stabilizer includes a first gain MOSFET coupled in parallel with said first zero MOSFET and said first capacitor, and a second gain MOSFET coupled in parallel with said second zero MOSFET and said second capacitor.

* * * * *